United States Patent
Motokawa et al.

(10) Patent No.: US 6,452,140 B1
(45) Date of Patent: Sep. 17, 2002

(54) FLOATING/MELTING USING DUMMY MICRO-GRAVITATIONAL FIELD BY MAGNETIC FORCE

(75) Inventors: Mitsuhiro Motokawa, Sendai (JP); Kazuo Watanabe, Iwanuma (JP); Satoshi Awaji, Sendai (JP); Iwao Mogi, Sendai (JP); Naoyuki Kitamura, Ikeda (JP); Masaki Makihara, Ikeda (JP)

(73) Assignees: Japan Science and Technology Corporation (JP); Japan as Represented by Director-General of National Institute of Advanced Industrial Science and Technology, Ministry of Economy, Trade and Industry (JP)

( * ) Notice: Subject to any disclaimer, the term of this patent is extended or adjusted under 35 U.S.C. 154(b) by 0 days.

(21) Appl. No.: 09/787,150

(22) PCT Filed: May 18, 2000

(86) PCT No.: PCT/JP00/03201

§ 371 (c)(1),
(2), (4) Date: Mar. 14, 2001

(87) PCT Pub. No.: WO01/16412

PCT Pub. Date: Mar. 8, 2001

(30) Foreign Application Priority Data

Aug. 27, 1999 (JP) .......................................... 11-241337

(51) Int. Cl.$^7$ ................................................ H05B 6/32
(52) U.S. Cl. ........................................ 219/648; 373/139

(58) Field of Search ................................. 373/138, 139, 373/140, 142, 156, 158; 219/647, 648; 361/19, 58, 141

(56) References Cited

U.S. PATENT DOCUMENTS

| | | | | |
|---|---|---|---|---|
| 5,003,551 A | * | 3/1991 | Mortimer | 373/139 |
| 5,319,670 A | * | 6/1994 | Fox | 373/138 |
| 5,528,620 A | * | 6/1996 | Fujita et al. | 373/139 |
| 5,650,903 A | * | 7/1997 | Gross et al. | 361/19 |

OTHER PUBLICATIONS

Tagami et al, "Solidification of levitating water in a gradient strong magnetic field", Journal of Crystal Growth, pp. 594–598, received Jan. 22, 1999.*

Tagami, M. et al. —"Solidification of Levitating Water in a Gradient Strong Magnetic Field", *Journal of Crystal Growth*, 203:594–598 (Jun. 1999).

* cited by examiner

Primary Examiner—Tu Ba Hoang
(74) Attorney, Agent, or Firm—Webb Ziesenheim Logsdon Orkin & Hanson, P.C.

(57) ABSTRACT

A substance 6 is located in a gradient magnetic field and held in a levitating state by a magnetic force produced by the gradient magnetic field. The substance 6 as such in the levitating state is heated and melted by ray or heat irradiation or by a resistance heater. Thereafter, the heating is stopped, and the substance 6 is cooled as such in the levitating state. Since the magnetic force realizes the microgravity field where the substance 6 is melted and cooled in the levitating state, the substance 6 is formed to an ideally spherical shape with an extremely smooth surface.

9 Claims, 2 Drawing Sheets

FLOATING/MELTING USING DUMMY MICRO-GRAVITATIONAL FIELD BY MAGNETIC FORCE

TECHNICAL FIELD OF THE INVENTION

Figure 1:
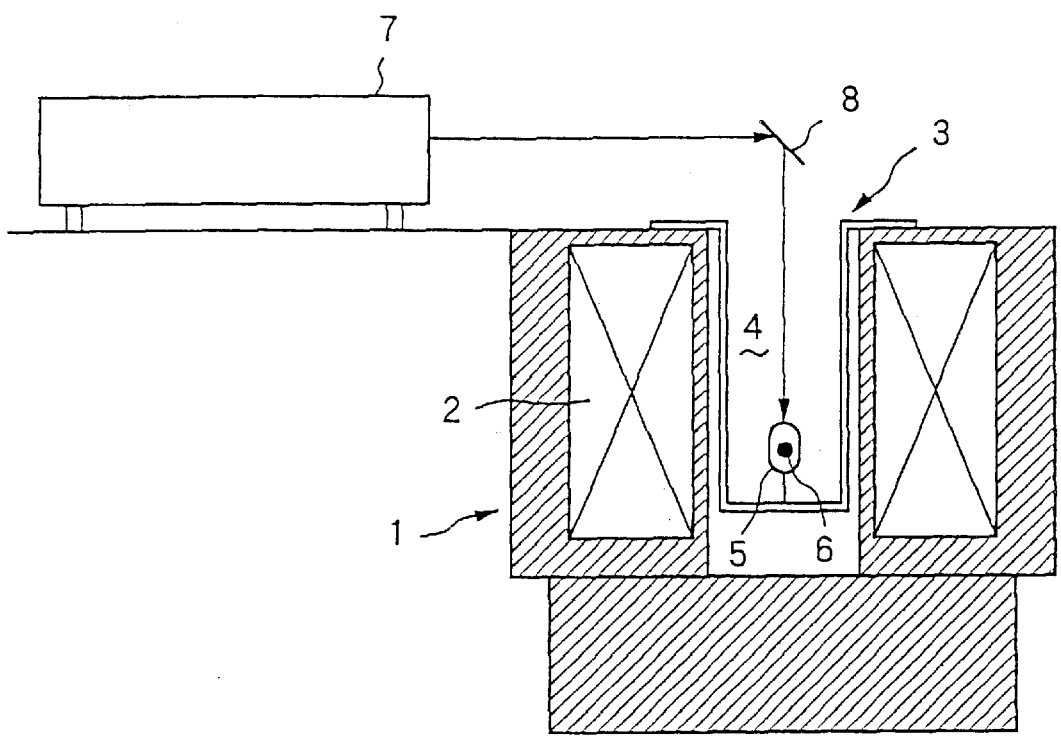

The present invention relates to a method of heating, melting and cooling a substance held in a levitating state by a magnetic force produced by a gradient magnetic field, and also relates to a levitation-melting apparatus as well as a spherical substance manufactured threreby.

BACKGROUND OF THE INVENTION

A demand for provision of a material, which is extremely purified or formed to an ideal shape with extremely smooth surface becomes stronger and stronger in response to progress of technologies such as electronics and optics. A conventional method for melting material uses a container such as a crucible or mold in general, but the melted material is likely to be contaminated with a substance dissolved from the container. In this regard, a melting method without use of a container has been developed in order to avoid contamination of a melted substance with the container.

A melting method for synthesis of a substance at a high temperature without use of a container is performed in a gravitational levitating state generated by an electrostatic force, an electromagnetic force, a force of gas stream or a force of acoustic waves or in a microgravity field generated in an outer space or by free fall using an airplanes or a drop tower. Such the method of melting a substance in microgravity levitating state was experienced in the outer space in 1992 using an acoustic levitating furnace, and its usefulness was recognized. However, it is necessary to establish a method which can realize a levitating state on the ground instead of the outer space, in order to make the microgravity levitating method applicable to industries with economical efficiency.

In an electrostatic method, a substance is electrostatically charged and held in a levitating state by attractive and repulsive forces produced by an electric field. Formation of a stable point in the electric field for levitating a substance at its center is necessary for realization of a stable levitating state. However, it is difficult to generate such an electric field having a stable point, and retention of an electrostatically charged state is practically impossible at a high-temperature atmosphere necessary for holding a substance in a molten state.

In an electromagnetic induction method, an induced current is generated in a substance by fluctuation of a magnetic field, so as to hold the substance in a levitating state by a repulsive force derived from the induced current. Due to a producing mechanism of the repulsive force, the substance shall be electrically conductive, but a levitating force does not effect on an insulator such as glass.

In a method using a gas stream, a substance is held in a levitating state without any restrictions on electroconductivity or chemical composition, and levitation of a massive substance is also possible by increase of a gas stream. However, increase of the gas stream makes it difficult to heat and melt the substance. The gas stream also causes big fluctuation of a melt, which is inappropriate for production of a spherical product or a product having a smooth surface.

By an acoustic method, a substance is held in a levitating state regardless of electroconductivity. But, a levitating force produced by an acoustic field is extremely small compared with an electromagnetic force or a force of a gas stream, so puts restrictions on a size or mass of a substance to which the method is applicable.

Fluctuation of a melt derived from high-frequency vibration in the method using electromagnetic induction or acoustic waves causes unfavorable material flow in a melt, resulting in mal-shape of a product.

In the methods using any of an electrostatic force, an electromagnetic induction force, a force of a gas stream and a force of acoustic waves, a substance is held in a levitating state by application of an upward force, so that atoms or molecules of the substance are in a state charged with a gravity of 1G. Consequently, vortex in a melt is unavoidable, when the substance is partially expanded or shrunk due to thermal distribution which occurs during a heating step. Ununiform distribution of components. is also unavoidable due to difference in specific gravity originated in chemical composition. Even if a levitating state free from fluctuation would be realized in such the method, an obtained spherical product is of a deformed shape due to affection of gravity applied on a surface of a molten substance.

A method using free fall realizes an extremely tiny gravity, since each gravity affected on atoms or molecules is offset together without substantial influences in response to a kind or size of a substance. There is neither vortex nor ununiform distribution caused by difference in specific gravity. However, a time period of free fall capable of keeping such a microgravity field is very short, if such the method is performed on the ground. For instance several seconds in a case using a drop tower, 20 seconds or so in parabolic flight of an airplane, and only a few minutes even in trajectory flight of a rocket. That is, it is actually impossible to complete all processes from melting to cooling steps necessary for production of a spherical product. Of course, a levitating state can be maintained over an infinitely long time in the outer space, but incommensurably huge cost is required.

As aforementioned, a method of melting and cooling a substance in a levitating state on the ground is not practical due to unresolved problems on chemical composition, electroconductivity or mass of a substance in :addition to a holding time period and stability of a microgavity field. In this regard, a new process, which maintains a microgravity field for a long time on the ground enough to melt and solidify a substance in a stable levitating state, has been demanded for production of a product having an ideal spherical shape with an extremely smooth surface.

The present invention aims at provision of such a process capable of production of a product having an ideal spherical shape with an extremely smooth surface. An object of the present invention is to realize a microgravity field suitable for heating, melting and cooling a substance without any time constraints by using a magnetic force produced by a gradient magnetic field.

DISCLOSURE OF THE INVENTION

According to the present invention, a substance is located in a gradient magnetic field, held in a levitating state by a magnetic force produced by the gradient magnetic field, heated and melted as such in the levitating state by ray or heat irradiation or by a resistance heater, and then cooled as such by stopping the ray or heat irradiation or the resistance heating.

A levitation-melting apparatus therefor comprises means for generation of a gradient magnetic field, means for holding a substance at a stable point of the generated magnetic field, and means for heating the substance with ray or heat irradiation or by a resistance heater. A product obtained by this method is of a spherical shape superior of smoothness due to a surface tension generated in a molten state.

BRIEF DESCRIPTION OF THE INVENTION

Figure 2:
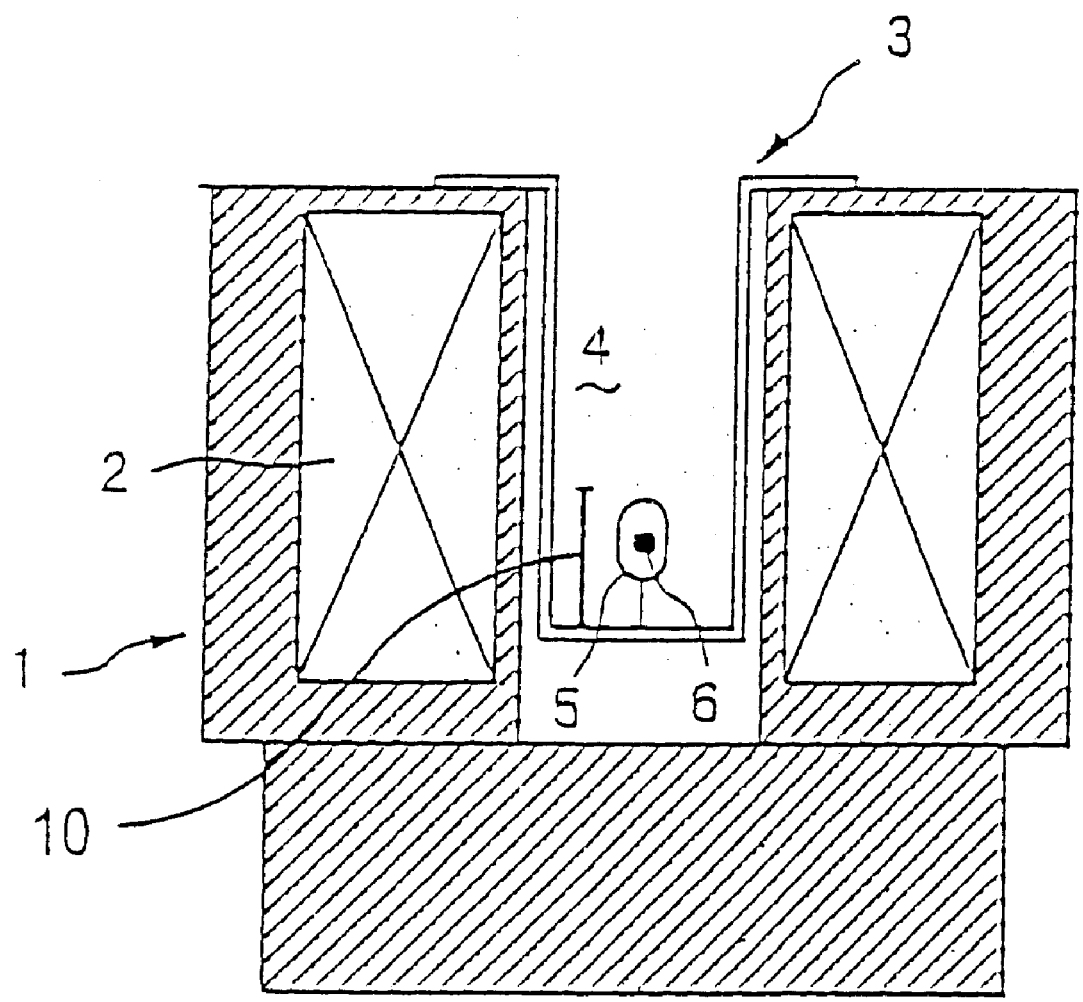

FIG. 1 is an example of a levitation melting apparatus according to the present invention; and FIG. 2 is another embodiment of a levitation-melting apparatus according to the present invention.

PREFERRED EMBODIMENTS OF THE INVENTION

Any substance in a molten state exhibits diamagnetism or paramagnetism, and an electromagnetic potential energy applied to a substance in an even magnetic field is uniform regardless parts of the substance, so that the substance is affected by no force. On the other hand, a magnetic force F represented by the under-mentioned formula is applied to a substance held in a gradient magnetic field. A direction of the magnetic force F in case of diamagnetism corresponds to a direction of the gradient magnetic field, since magnetic susceptibility is negative. In case of paramagnetism, a direction of the magnetic force F is reverse to a direction of the gradient magnetic field, since magnetic susceptibility is a positive.

$$F = \chi/\mu_0 \cdot BdB/dz$$

Herein F is a magnetic force (N/kg).

$\chi$ is magnetic susceptibility (m$^3$/kg), $\mu_0$ is vacuum permeability ($4\pi \times 10^{-7}$)

B is a magnetic field (T), z is a vertical coordinate (m), and

BdB/dz is a gradient of a magnetic field (T$^2$/m)

Downward gravity (1N per 1 kg) in a gravity field is offset by application of an upward magnetic force F with the same magnitude produced by the gradient magnetic field, so as to hold a substance in a levitating state. Since the magnetic force F effects on each atom or molecule of the substance, production of such the magnetic force with the magnitude equal to the gravity enables occurrence of a microgravity field effective for holding the substance in a levitating state.

The magnetic force F necessary for flotation of a substance is different in response to magnetic susceptibility of the substance. For instance, a magnetic gradient BdB/dz of $-1988T^2$/m for silicon dioxide SiO$_2$ (diamagnetic substance, magnetic susceptibility of $-6.19$ m$^3$/kg), and a magnetic gradient BdB/dz of $-1748T^2$/m for boron oxide B$_2$O$_3$ (diamagnetic substance, magnetic susceptibility of 7.04 m$^3$/kg ). In any case of a diamagnetic substance whose magnetic susceptibility is negative, the magnetic force F effects along a magnetism-decreasing direction in the gradient magnetic field.

In case of a paramagnetic substance, whose magnetic susceptibility is positive, the magnetic force F effects along a magnetism-increasing direction in the gradient magnetic field. Some paramagnetic substances. exhibit magnetic susceptibility of several decades to several hundred times magnetic susceptibility of a diamagnetic substance. For instance, ferrous oxide Fe$_2$O$_3$ exhibits magnetic susceptibility of 1259 m$^3$/kg, and a gradient of a magnetic field is 9.8T$^2$/m enough to hold it in a magnetically levitating state.

A ferromagnetic substance exhibits big positive magnetic susceptibility, but it changes to a paramagnetic state above a transition temperature. Such the magnetic transition is accompanied with change of magnetic susceptibility. In this regard, a ferromagnetic substance is preferably converted to a paramagnetic state by heat-treatment in prior to melting it in a levitating state, so as to inhibit dislocation of the substance: during magnetic transition.

A difference in specific gravity is made smaller by application of a magnetic force, compared with a difference in a normal gravity field, even in the case where atoms or molecules of the substance are different in magnetic susceptibility except for co-existence of a paramagnetic substance with a diamagnetic substance. Consequently, such a difference in specific gravity does not substantially effect on material transfer of a substance. The term of "molecule" used in the specification involves atom clusters.

A diamagnetic repulsive force or a paramagnetic attractive force, which is produced in a steady gradient magnetic field, is used as a magnetic force for holding a substance in a levitating state. Application of such the magnetic force is combined with heating means which does not cause unfavorable fluctuation or vibration of the gradient magnetic field. Consequently, a stable levitating state is kept over a long period of time, and a substance is melted and solidified as such in the levitating state. The heating means may be ray or heat irradiation using a light source such as a laser or lamp, or resistance heating using a resistance heater composed of wiring structure capable of offsetting a magnetic field during energization.

The heating means using a light source heats a substance by introduction of ray or heat to the substance through optical devices such as lens, mirror or optical fiber. In case of using a resistance heater, a substance is held in a levitating state near the heater and heated by radiant heat or the like from the heater. During heating, gravity effecting on each atom or molecule is offset by the magnetic force, so as to produce a microgravity field. The substance melted in the levitating state is formed to a spherical droplet with an extremely smooth surface due to a surface tension of the substance itself. When heating is stopped in such the state, the droplet is cooled and solidified by heat radiation, and formed to a spherical solid with an extremely smooth surface without contamination.

The levitation-melting process is performed using a levitation-melting apparatus shown in FIG. 1 for instance.

A magnetic field generator 1 has a cylindrical wall containing a magnet 2 therein. A heat-insulating container 3 is located inside the cylindrical wall in order to inhibit diffusion of radiant heat during heating, a basket 5 is located in a process cavity 4 inside the heat-insulating container 3, and a substance 6 to be melted is received in the basket 5. A reflector mirror or a condensing reflector mirror 8 is attached to an opening of the heat-insulating container 3, to reflect ray or heat from a heating light source 7 and to invite the ray or heat to the substance 6.

The magnet 2 may be a water-cooled magnet, a superconducting magnet or permanent magnet, as far as an intensive magnetic field can be generated. A water-cooled magnet consumes a considerably big quantity of an electric power for holding the substance 6 in a levitating state. Consumption of an electric power can be remarkably saved by use of a super-conducting magnet.

The basket 5 shall be durable to hold the substance 6 up to a levitating state. There are no restrictions on shape and material of the basket 5, as far as the substance 6 is held at a position near a magnetic levitating point without harmful influences on heating. An atmosphere, to which the substance 6 is exposed, may be the open air, inert gas or reactive gas. The substance 6 may be also held in a vacuum atmosphere.

The heating light source 7 may be an infrared laser or lamp which emits ray or heat. A position of the light source 7 is not restrictive, as far as the substance 6 is directly or indirectly irradiated with ray or heat. When a resistance heater 10 (shown in FIG. 2) is used instead of the light source 7, it is preferably located at a position near the substance 6 in the process cavity 4 to increase an efficiency of an input energy.

The reflector mirror 8 may be a concave mirror which condenses ray or heat for improvement of heating efficiency. The same effect can be also attained by combination of a plane mirror with a condenser lens.

A gradient magnetic field is generated to produce an upward magnetic force necessary for holding the substance 6 in a levitating state. In case of a cylindrical magnet, a gradient of a magnetic field becomes bigger from a center to an outer side along an axial direction. In case of a hybrid magnet involving a small-sized cylindrical water-cooled magnet located in a big-sized cylindrical super-conducting magnet, a gradient magnetic field is generated at a position axially apart in a few cm from a center of the small-sized magnet by controlling electricity supplied to each magnet. For instance, when an input power to each magnet is adjusted so that magnetic field is 21T at the center and a gradient of $-1988T^2/m$ is generated at a position higher by 75 mm than the center. Under this condition, a levitating position is stabilized along both of horizontal and vertical directions.

The substance 6 levitates at a position where a gravity is offset by a gradient magnetic field. If the substance 6 is dislocated from such the position due to any external force, motion of the substance 6 along one direction continues under the condition that the gravity is offset without an obstacle. On the other hand, the substance 6 is held at a predetermined position, i.e. a stable point where there is a magnetic field which produces a magnetic force to return the substance at its original position. That is, when the magnetic field is intensified at a position apart in a distance corresponding to the substance 6 from the stable point, a bigger returning force affects on the substance 6. Since an effect of gravity is basically offset, the returning force may be a small value which can be negligible in comparison with the gravity.

When a gradient magnetic field with a proper distribution is generated by the magnetic field generator 1, the substance 6 is held in a levitating state at a predetermined position in the process cavity. 4. The levitating state of the substance 6 is left as such regardless lapse of time. The substance 6 held in the levitating state is heated with ray or heat irradiation from the light source 7.

Atoms or molecules of the heated substance 6 are fluidized at a temperature above a melting temperature in case of a crystalline substrate or above a transition temperature in case of a glassy substance. The fluidized substance 6 is formed to a spherical shape with a smooth surface due to a surface tension. After the substance 6 is heated for a sufficient time (which depends on chemical composition of the substance 6 and a heating temperature), radiation of ray or heat from the heating light source 7 is stopped to cool and solidify the substance 6. Thereafter, the gradient magnetic field is eliminated to cancel the levitating state, and a spherical product is obtained.

EXAMPLE 1

An oxide lump 1 g having the under-mentioned composition was prepared as a substance 6. The substance 6 was received in a basket 5, and a magnetic field with a gradient of $-1990T^2/m$ was generated by a magnetic field generator 1.

| | |
|---|---|
| silicon dioxide ($SiO_2$): | 68.9 mass % |
| boron oxide ($B_2O_3$): | 10.1 mass % |
| sodium oxide ($Na_2O$): | 8.8 mass % |
| potassium oxide ($K_2O$): | 8.4 mass % |
| barium oxide (BaO): | 2.8 mass % |
| arsenic oxide ($As_2O_3$): | 1.0 mass % |

The substance 6 was held in a levitating state by a magnetic force produced by the gradient magnetic field, and the levitating state was kept under a stable condition. A beam was emitted from a carbon dioxide gas laser of output 40W as a heating light source 7, condensed by a condensing reflector mirror 8, and injected to the substance 6 for 5 minutes. When 1 minute lapsed after the beginning of irradiation, the substance 6 was heated at a temperature above a transition temperature of 565° C. and liquefied. After the substance 6 was kept 4 minutes in a liquefied state, the substance 6 was formed to a spherical shape due to a surface tension. Thereafter, irradiation with the laser beam was stopped, the substance 6 was cooled as such for 2 minutes and then cooled down to a room temperature. A product obtained in this way was a spherical transparent body with a smooth surface.

EXAMPLE 2

A lump 1 g of boron oxide ($B_2O_3$) as a substance 6 was received in a basket 5 and exposed to a magnetic field with a gradient of $-1750T^2/m$ generated by a magnetic field generator 1, in the same way as in Example 1. The gradient magnetic field produced a magnetic force to hold the substance 6 in a levitating state. A beam dispatched from a carbon dioxide gas laser of output 30W as a heating light source 7 was condensed by a condensing reflector mirror 8, and injected to the substance 6 for 3 minutes. At a time 30 seconds after from the beginning of irradiation, the substance 6 was heated at a temperature above its transition temperature of 290° C. and liquefied. When the liquefied state was maintained 150 seconds, the substance 6 was formed to a spherical shape due to its surface tension. Thereafter, the laser beam irradiation was stopped, and the substance 6 was cooled as such and then cooled down to a room temperature. A product obtained in this way was a spherical transparent body with a smooth surface.

EXAMPLE 3

A lump 1 g of silicon dioxide ($SiO_2$, a transition temperature of 1100° C.) as a substance 6 was received in a basket 5 and exposed to a magnetic field with a gradient of $-1990T^2/m$ generated by a magnetic field generator 1. The gradient magnetic field produced a magnetic force to stationarily hold the substance 6 in a levitating state. A beam dispatched from a carbon dioxide gas laser of output 60W as a heating light source 7 was condensed by a condensing reflector mirror 8, and injected to the substance 6 for 1 minutes. At a time 5 seconds after from the beginning of irradiation, a temperature of the substance 6 exceeded 1700° C., and a surface of the substance 6 was liquefied and partially vaporized. The substance 6 held in the levitating state was formed to a spherical shape due to its surface tension. Thereafter, the laser beam irradiation was stopped, and the substance 6 was cooled down to a room temperature. The partially vaporized substance 6 was solidified during cooling. A product obtained in this way was a spherical fine particle with a smooth surface.

In any of Examples 1 to 3, a spherical body with a smooth surface was obtained regardless a size of the substance 6, as far as the substance 6 was held in a levitating state.

INDUSTRIAL APPLICABILITY OF THE INVENTION

According to the present invention as aforementioned, a substance is held in a levitating state by a magnetic force produced by a gradient magnetic field, and as such melted with a heat. The melted substance is reformed to a spherical shape due to its surface tension. Since the levitating state is continuously maintained regardless lapse of time, it is possible to assure a sufficient time necessary for execution of heating, melting and cooling the substance. The processed substance is formed to an ideally spherical body with an extremely smooth surface, due to the facts that material flow derived from difference in specific gravity is suppressed as compared with a process in a gravity filed and that fluctuation is also suppressed unlike a levitating state realized by an electromagnetic or acoustic force. A product obtained in this process is well purified, since the process does not need a container which would be partially dissolved and included as contaminants in the product. Such the product is useful as an advanced-functional device, which requires a smooth surface with less impurities, in various technical fields such as an optical device, an electronic device and medical application.

What is claimed is:

1. A levitation-melting method using a microgravity field, comprising the steps of:

positioning a substance in a gradient magnetic field wherein said gradient magnetic field is in accordance with an empirical relationship.

$$F=\chi/\mu_0 \cdot BdB/dz$$

wherein F is a magnetic force (N/kg), $\chi$ is magnetic susceptibility (m$^3$/kg), $\mu_0$ is vacuum permeability ($4\pi \times 10^{-7}$), B is a magnetic field (T), z is a vertical coordinate (m), BdB/dz is a gradient of a magnetic field (T$^2$/m).;

holding said substance in a levitating state by a magnetic force produced by said gradient magnetic field;

heating and melting said substance in said levitating state;

stopping said heating; and cooling said substance as such in said levitating state.

2. The method according to claim 1, wherein said heating is by ray.

3. The method according to claim 1, wherein said heating is by heat irradiation.

4. The method according to claim 1, wherein said heating is by resistance heating.

5. A levitation-melting apparatus using a microgravity field, comprising:

a magnet which generates a gradient magnetic field wherein said gradient magnetic field is in accordance with an empirical relationship.

$$F=\chi/\mu_0 \cdot BdB/dz$$

wherein F is a magnetic force (N/kg), $\chi$ is magnetic susceptibility (m$^3$/kg), $\mu_0$ vacuum permeability ($4\pi \times 10^{-7}$), B is a magnetic field (T), z is a vertical coordinate (m), BdB/dz is a gradient of a magnetic field (T$^2$/m).;

means for holding a substance at a stable point of said gradient magnetic field; and heating means for heating said substance;

wherein said substance is held in a levitating state in a microgravity field by a magnetic force produced by said gradient magnetic field.

6. The apparatus according to claim 5, wherein said heating means is by ray.

7. The apparatus according to claim 5, wherein said heating means is by heat irradiation.

8. The apparatus according to claim 5, wherein said heating means is by resistance heating.

9. A spherical product with a smooth surface produced by the method defined in claim 1.

* * * * *